(12) United States Patent
Chang

(10) Patent No.: US 12,354,844 B2
(45) Date of Patent: Jul. 8, 2025

(54) SYSTEM AND METHOD FOR HEATING THE TOP LID OF A PROCESS CHAMBER

(71) Applicant: Taiwan Semiconductor Manufacturing Co., Ltd., Hsinchu (TW)

(72) Inventor: Kuo-Shiou Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 966 days.

(21) Appl. No.: 17/402,315

(22) Filed: Aug. 13, 2021

(65) Prior Publication Data

US 2023/0048430 A1   Feb. 16, 2023

(51) Int. Cl.
*H01J 37/32* (2006.01)
*H01L 21/311* (2006.01)
*H01L 21/66* (2006.01)

(52) U.S. Cl.
CPC .. *H01J 37/32522* (2013.01); *H01L 21/31116* (2013.01); *H01L 21/31144* (2013.01); *H01L 22/20* (2013.01); *H01J 2237/334* (2013.01)

(58) Field of Classification Search
CPC .......... H01J 2237/334; H01J 37/32522; H01L 21/31116; H01L 21/31144; H01L 21/32136; H01L 21/67103; H01L 21/6719; H01L 21/67248; H01L 22/20
USPC ....................................................... 219/667
See application file for complete search history.

(56) References Cited

U.S. PATENT DOCUMENTS

| | | | | |
|---|---|---|---|---|
| 5,735,993 A * | 4/1998 | Yoshida | ............ | H01J 37/32165 156/345.48 |
| 10,818,481 B2 * | 10/2020 | Sun | .................... | H01J 37/32935 |
| 11,158,527 B2 * | 10/2021 | Benjaminson | .... | H01L 21/68785 |
| 2012/0090784 A1 * | 4/2012 | Ouye | ....................... | H05B 3/42 156/345.37 |
| 2021/0375586 A1 * | 12/2021 | Kangude | ........... | H01J 37/32522 |

* cited by examiner

*Primary Examiner* — Chris Q Liu
*Assistant Examiner* — James F Sims, III
(74) *Attorney, Agent, or Firm* — Seed IP Law Group

(57) ABSTRACT

A semiconductor process system includes a process chamber with a lid. The system includes a heater positioned on the lid and a controller configured to control the heater. The controller operates the heater to provide a selected temperature distribution of the lid.

20 Claims, 10 Drawing Sheets

SYSTEM AND METHOD FOR HEATING THE TOP LID OF A PROCESS CHAMBER

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin film deposition and etching techniques are implemented. These techniques can form very thin films. Small features can be formed in the thin films by various etching techniques. However, in some cases the size of the features may not be uniform in all areas of a wafer. If the size of features is not uniform across the wafer, then it is possible that integrated circuits that are diced from the wafer many not meet specifications. Accordingly, some integrated circuits or even entire wafers may be scrapped.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
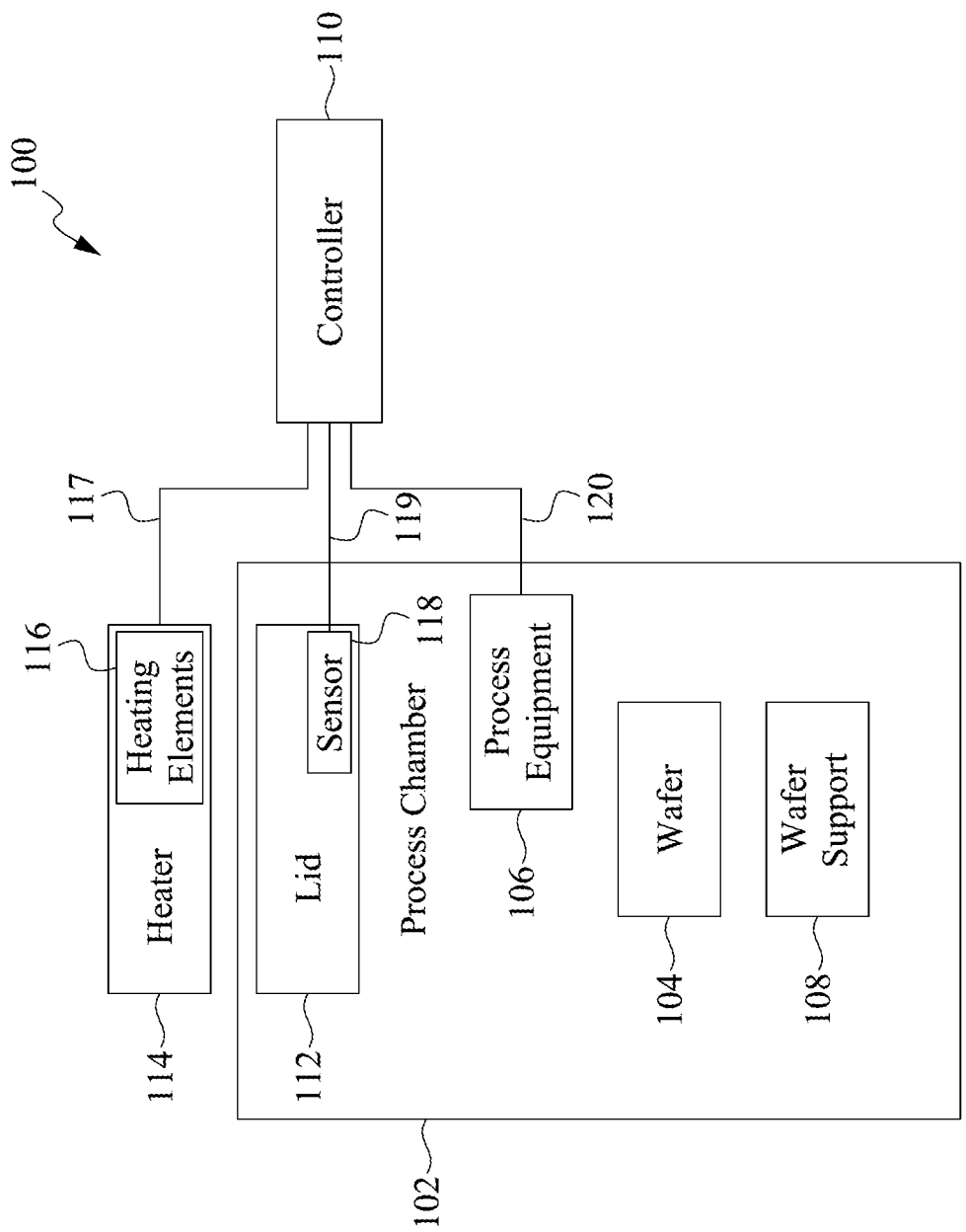
FIG. 1 is a block diagram of a semiconductor process system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits over traditional semiconductor process systems. Embodiments of the present disclosure promote uniformity of features on a wafer by selectively heating the lid of a semiconductor process system. The temperature of the lid of the process system can affect the temperature of a wafer being processed. Embodiments of the present disclosure provide a lid with an array of heating elements that can be selectively operated during a semiconductor process to ensure a selected temperature distribution across the lid. Carefully controlling the temperature of the lid during the process promotes uniform features in the wafer. The result is that integrated circuits diced from the wafer will have uniform features and functionality. Fewer integrated circuits and wafers will be scrapped. Thus, wafer yields are greatly increased.

FIG. 1 is a block diagram of a semiconductor process system 100, according to one embodiment. The semiconductor process system 100 includes a semiconductor process chamber 102 for performing one or more semiconductor processes on a wafer 104. The semiconductor process system 100 includes semiconductor process equipment 106, a wafer support 108, and a controller 110. The components of the semiconductor process system 100 cooperate to perform semiconductor processes on the wafer 104 and to ensure that the semiconductor processes are successful.

In one embodiment, the wafer 104 is a semiconductor wafer. Typically, semiconductor wafers undergo a large number of processes during fabrication. These processes can include thin-film depositions, photoresist patterning, etching processes, dopant implantation processes, annealing processes, and other types of processes. After all of the processing steps are complete, the wafer 104 will be diced into a plurality of individual integrated circuits.

The temperature of the wafer can affect the various semiconductor processes. If the temperature of the wafer is not uniform, then it is possible the features formed in the wafer will not be uniform at the various regions of the wafer. The temperature of the top surface of a wafer can be affected by many factors. For example, the process chamber 102 includes a lid 112. The temperature of the lid 112 can affect the temperature of the top surface of the wafer 104.

The semiconductor process system 100 includes a heater 114. The heater 114 heats the lid 112. Accordingly, the heater 114 can control the temperature of the lid 112. This in turn can promote uniformity of features formed in the wafer 104.

The heater 114 includes a plurality of heating elements 116. The heating elements 116 generate heat. The array of heating elements 116 is distributed to facilitate selective heating of the lid 112. The heating elements 116 are distributed such that when the wafer 104 is positioned on the wafer support 108, each region of a bottom surface of the lid 112 is positioned directly below one of the heating elements 116. The distribution of a large number of heating elements 116 on the lid 112 can help ensure that all areas of the lid 112 are evenly heated. This can help ensure that the temperature of the wafer 104 during a semiconductor process is even throughout all regions of the wafer 104. If the temperature of the wafer 104 is substantially even across the top surface of the wafer 104, then in many cases it is more likely that the semiconductor process will be completed properly.

One possible way to heat the lid 112 during a semiconductor process is to have a single large heating element, such as a heating coil, positioned on the lid 112. However, one problem with this approach is that it typically leads to uneven temperatures across the surface of the lid 112. This is because a center portion of the lid 112 may be heated to a higher temperature than peripheral portions of the lid. This, in turn, may lead to a central area of the top surface of the wafer 104 having a higher temperature than peripheral areas of the wafer. The uneven temperature distribution across the surface of the wafer 104 may result in the failure of semiconductor processes. For example, if a central portion of the top surface of the wafer is hotter than peripheral portions of the wafer during an etching process of a thin film, then features of the thin film may have different dimensions in the central region of the wafer 104 than the thin-film may be thicker at the central regions than at the peripheral regions. This can result in integrated circuits with mismatched features and performance, or even integrated circuits that do not function at all.

In one embodiment, the semiconductor process system 100 overcomes this by providing an array of heating elements 116. Because the heater 114 includes a large number of heating elements 116 evenly distributed below a top surface of the lid 112, the heating elements 116 can evenly heat the lid 112. Accordingly, the bottom surface of the lid 112 can have a substantially even temperature at central and peripheral regions. In the example of a thin film etching process, this results in a thin-film with uniform thickness and other physical characteristics.

In one embodiment, the heating elements 116 are connected to the controller 110 by one or more electrical connectors 117. The controller 110 controls the function of the heating elements 116. In particular, the controller 110 can activate or deactivate the heating elements 116. Activating the heating elements 116 corresponds to causing the heating elements 116 to generate heat. Deactivating the heating elements 116 corresponds to causing the heating elements to stop generating heat. Furthermore, the controller 110 can control how much heat is generated by the heating elements 116. Accordingly, the controller 110 can raise or lower the temperature of the lid 112 by causing the heating elements 116 to increase or decrease heat output.

Though not illustrated in FIG. 1, in one embodiment, the controller 110 can include one or more power sources. The power sources can supply power to the heating elements 116 to enable the heating elements 116 to generate heat. Alternatively, the controller 110 is connected to a power source that is connected to the heating elements 116. In this case, the controller 110 controls the heating elements 116 by controlling output of the power source to the heating elements 116.

In one embodiment, the heating elements 116 are electrical heating elements. The electrical heating elements 116 can include an electrical conductor or resistor. The heating elements 116 generate heat by passing a current through the electrical conductor or resistor. The heating elements 116 can each include a respective conductive coil. The heating elements generate heat by passing an electrical current through the conductive coils. Other types of heating elements 116 can be utilized without departing from the scope of the present disclosure.

In one embodiment, the controller 110 is configured to selectively control each heating element 116. In this case, the controller 110 can selectively activate each individual heating element 116. Thus, the controller 110 is able to activate some heating elements 116 without activating other heating elements 116. Additionally, the controller can control the various heating elements 116 to generate differing amounts of heat. In some cases it may be beneficial to heat some regions of the lid 112 more than other regions. The wafer support 108 and the controller 110 enable selective heating of different regions of the wafer 104.

In one embodiment, the controller 110 is configured to selectively control how much heat is generated by each heating element 116. The controller 110 selectively causes some heating elements 116 to generate more heat than other heating elements 116. In one example, peripheral regions of the lid 112 may tend to dissipate more heat than central regions of the lid 112. Accordingly, to ensure an even temperature of the lid 112, the controller 110 may control peripheral heating elements 116 to generate more heat than central heating elements 116 to account for the greater amount of heat dissipation at the peripheral regions of the wafer 104. The electrical connectors 117 can include a large number of electrical connectors 117 that enable selective heating of individual heating elements 116.

In one embodiment, the lid 112 includes one or more temperature sensors 118. The temperature sensors 118 are configured to sense the temperature of the lid 112. The temperature sensors 118 can be positioned in thermal contact with the lid 112. The thermal contact enables the temperature sensors 118 to sense the temperature of the lid 112. Alternatively, the temperature sensors 118 may be positioned adjacent to, but not in thermal contact with, the lid 112.

In one embodiment, the temperature sensors 118 are electrically connected to the controller 110 by plurality of electrical connectors 119. The temperature sensors 118 can generate sensor signals indicative of the temperature of the heating elements 116, the wafer support 108, and/or the wafer 104. The temperature sensors 118 can pass the sensor signals to the controller 110. Each temperature sensor 118 can provide individual sensor signals to the controller 110. The sensor signals from an individual temperature sensor 118 indicate the temperature of the lid at or adjacent to the location of that temperature sensor 118.

In one embodiment, the controller 110 can control the heating elements 116 responsive to the sensor signals from the temperature sensors 118. The controller 110 can selectively activate or deactivate individual heating elements 116 responsive to the sensor signals from the temperature sensors 118. The controller 110 can adjust the heat output by individual heating elements 116 responsive to the sensor signals from the temperature sensors 118.

In one embodiment, the lid 112 includes a respective temperature sensor 118 for each heating element 116. Accordingly, for each heating element 116, a respective temperature sensor 118 generates sensor signals indicating the temperature of lid 112 adjacent to that heating element 116. In this case, the controller 110 receives sensor signals for each individual heating element 116. The controller 110 can then adjust the heat output of the individual heating elements 116 responsive to the respective sensor signals in order to generate or maintain a selected heat profile of the lid 112.

In one embodiment, the respective temperature sensor 118 for each heating element 116 senses the temperature of the lid at a region below the heating element 116. Accordingly, for each heating element 116, a respective lid 112 at a region above the heating element 116. The controller 110 receives sensor signals for each individual heating element 116. The controller 110 can then adjust the heat output of the individual heating elements 116 responsive to the respective sensor signals in order to generate or maintain a selected heat profile of the lid 112.

The semiconductor process system 100 includes semiconductor process equipment 106. The semiconductor process equipment 106 assists in performing the semiconductor processes. The semiconductor process equipment 106 can include equipment that assists in thin-film deposition processes, etching processes, ion implantation processes, annealing processes, photolithography processes, and other types of processes. The semiconductor process equipment 106 can include components for generating a plasma within the semiconductor process chamber 102. Some of the semiconductor process equipment 106 may be positioned entirely within the semiconductor process chamber 102. Some of the semiconductor process equipment 106 may be positioned partially within the semiconductor process chamber 102 and partially external to the semiconductor process chamber 102. Some of the semiconductor process equipment 106 may be positioned entirely external to the semiconductor process chamber 102.

The semiconductor process equipment 106 can include equipment for managing fluid flow within the semiconductor process chamber 102. The process equipment can include components for introducing gasses or fluids into the semiconductor process chamber 102, for removing gasses or fluids from the semiconductor process chamber, and for monitoring and controlling the flow, presence, or composition of gasses within the semiconductor process chamber 102. The semiconductor process equipment 106 can include equipment for retaining a selected pressure within the interior of the semiconductor process chamber 102.

The semiconductor process equipment 106 can include electrical components for generating electric fields, voltages, magnetic fields, electrical signals, or other types of electrical effects. Accordingly, the semiconductor process equipment 106 can include electrodes, wires, radiofrequency power sources, transmitters, receivers, or other types of electrical equipment that may be utilized in semiconductor processes.

In one embodiment, the controller 110 is communicatively coupled to the semiconductor process equipment 106 by one or more electrical connectors 120. The controller 110 can control the semiconductor process by controlling the semiconductor process equipment 106. The controller 110 can adjust operation of the semiconductor process equipment 106 responsive to sensor signals from the temperature sensors 118. For example, in some cases it may be beneficial to adjust a flow of deposition materials or other fluids into the deposition chamber based on the temperature of the wafer 104. In other cases it may be beneficial to adjust the parameters of plasma generation within the semiconductor process chamber 102 based on the temperature in the wafer 104. The controller 110 can make these adjustments responsive to the sensor signals from the temperature sensors 118.

In one embodiment, the controller 110 may cause the semiconductor process equipment 106 to entirely stop a semiconductor process in response to the sensor signals provided by the temperature sensors 118. In order to avoid serious damage to the semiconductor wafer 104, in some cases the controller 110 may determine that the best course of action is to stop the semiconductor process entirely until other adjustments or repairs can be made.

In one embodiment, the controller 110 can include portions external to the semiconductor process chamber 102, portions within the semiconductor process chamber 102, and/or portions executed within the cloud. Accordingly, the controller 110 may be distributed with various processing, memory, and data transmission resources in multiple locations. The controller 110 may also include virtual memory, processing, and data transmission resources in the cloud.

Figure 2A:
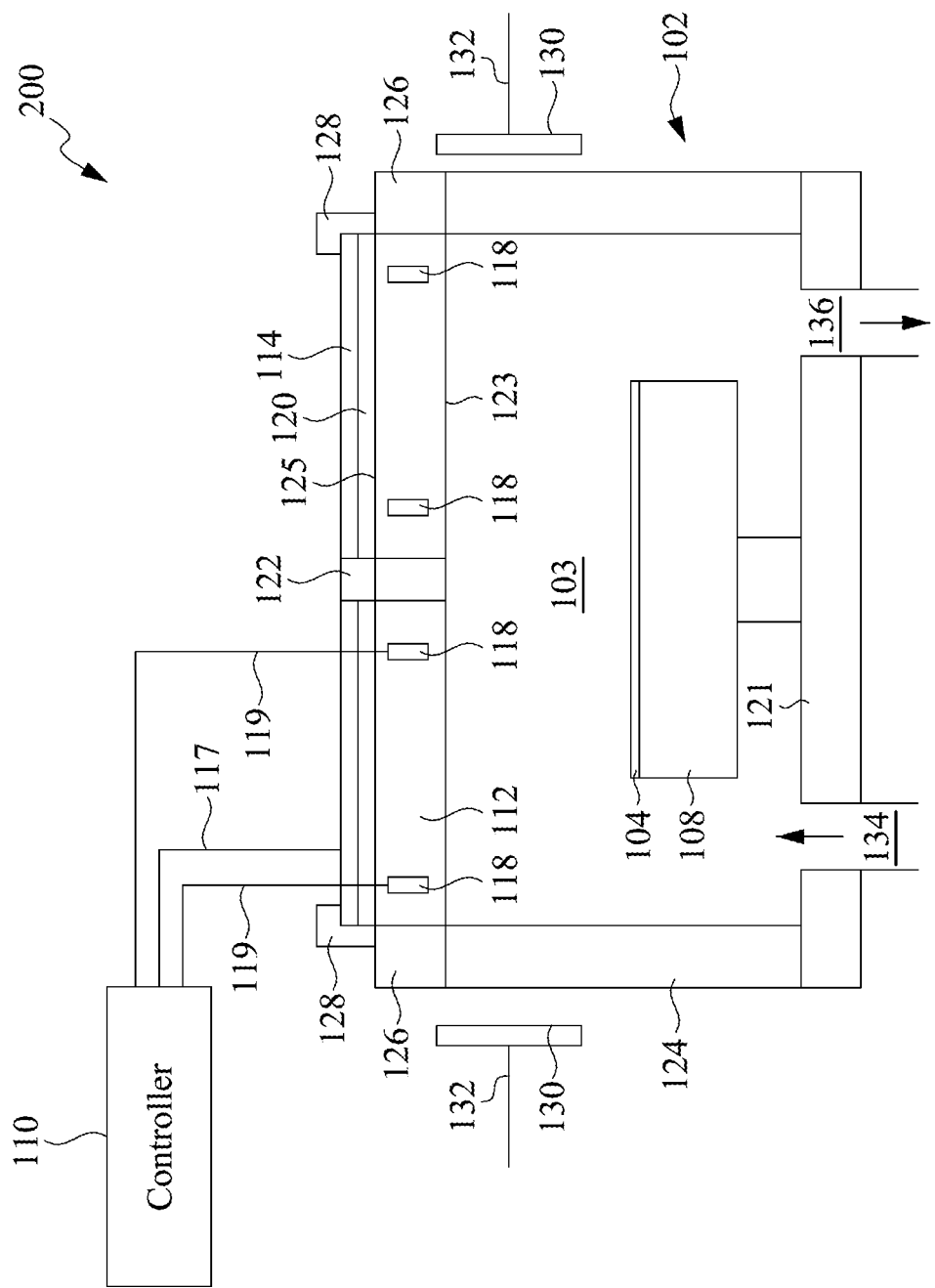
FIG. 2A is an illustration of a plasma etching system, according to one embodiment.

FIG. 2A is an illustration of a plasma etching system 200, according to one embodiment. The plasma etching system 200 is one example of a semiconductor process system discussed in relation to FIG. 1. The plasma etching system 200 includes a process chamber 102. The process chamber 102 defines an interior volume 103. A wafer support 108 is positioned within the interior volume 103. A wafer 104 is positioned on the wafer support 108. The plasma etching system 200 is configured to perform a plasma etching process on the wafer 104. The plasma etching process defines patterns in surface materials of the wafer 104 by removing material in exposed areas of the wafer. The process chamber 102 includes a sidewall 124, a floor 121, and a lid 112. The sidewall 124, the floor 121, and the lid 112 collectively enclose the interior volume 103.

In one embodiment, a fluid inlet 134 is positioned in the floor 121. A fluid outlet 136 is also positioned in the floor 121. Etching fluids are provided into the interior volume 103 via the fluid inlet 134. The exhaust fluids and debris are removed from the interior volume 103 via the outlet 136. Many other schemes can be utilized for providing etching fluids into the interior volume 103 during plasma etching processes and for removing exhaust fluids and debris from the interior volume 103 without departing from the scope of the present disclosure.

In one embodiment, the plasma etching system 200 includes electrodes 130 positioned external to the process chamber 102. A radiofrequency voltage is applied between the electrodes 130 via electrical leads 132. The radiofrequency voltage applied between the electrodes 130 causes the plasma to form within the interior volume 103 between the wafer 104 and the lid 112. In particular, the radiofrequency voltage can result in a plasma being formed from the etching fluids provided into the interior volume 103 via the fluid inlet 134. The plasmatized etching fluids etch the wafer 104. The electrodes 130 can include conductive coils, conductive plates, or other conductive structures for generating an electric field within the interior volume 103 in order to generate the plasma within the interior volume 103.

The temperature of the plasma and the temperature of the wafer 104 can affect the etching rate during the plasma etching process. Uneven temperature distributions on the surface of the wafer 104 can result in differing etching rates across the various regions of the wafer 104. The differing etching rates can result in different feature sizes. When forming very small features, even small differences in feature size can result in large differences in functionality of integrated circuits formed from the various regions of the wafer 104.

The temperature of the bottom surface 123 of the lid 112 can have an impact on the temperature distribution within the plasma and output surface of the wafer 104. Accordingly, the plasma etching system 200 includes a heater 114 positioned on the lid 112. The heater 114 can heat the lid 112. By careful control of the heater 114, the temperature distribution on the bottom surface 123 of the lid 112 can be controlled.

The heater 114 can include a plurality of heating elements 116 (not shown in FIG. 2A) as described in relation to FIG. 1. The plurality of heating elements 116 can be distributed so that the various areas of the lid 112 can be selectively heated. In this way, a temperature distribution of the lid 112 can be carefully controlled. The heating elements 116 can be coupled to the controller 110 by electrical connectors 117. While only a single electrical connector 117 is shown in FIG. 2A, in one example the heater 114 includes a plurality of heating elements 116, there may be one or more electrical connectors 117 connected to each heating element 116.

In one embodiment, the plasma etching system includes a pad 120 positioned between the lid 112 and the heater 114. The pad 120 can be placed directly on a top surface 125 of the lid 112. The heater 114 can then be positioned directly on the pad 120. The pad 120 can help protect the lid 112 from being damaged by the heater 114. The pad can have a thickness between 5 mm and 50 mm, though other thicknesses can be utilized without departing from the scope of the present disclosure.

The pad 120 can include a polymer material. A metal or other heat conducting material may be embedded within the polymer of material to help distribute heat from the heater 114 to the lid 112. The metal within the pad 120 can include copper or other suitable materials. In another example, the pad 120 can include a ceramic material. The pad 120 can include other materials without departing from the scope of the present disclosure.

In one embodiment, a lid ring 126 is positioned on the side wall 124 and fixed to the lid 112. Clamps 128 are coupled to the lid ring 126. The clamps 128 fix the heater 114 and the pad 120 to the lid 112. Alternatively, the heater 114 and the pad 120 may be fixed to the lid 112 in other ways. For example, the pad 120 may be coupled to the lid 112 by an adhesive material. The heater 114 may be coupled to the pad 120 by an adhesive material. Other methods for fixing the heater 114 and the pad 120 to the lid 112 can be utilized without departing from the scope of the present disclosure.

In one embodiment, the lid 112 includes a hub 122. The hub 122 is in the center of the lid 112. The hub 122 can include channels for passing a fluid into the interior volume 103. Alternatively, the hub 122 can include channels for passing electrical leads into the interior volume 103.

The plasma etching system 200 includes a plurality of temperature sensors 118. The temperature sensors 118 can be positioned at various locations on or in the lid 112. The temperature sensors 118 can be coupled to the controller 110 by electrical connectors 119.

In one embodiment, the temperature sensors 118 are thermocouples. The thermocouples generate voltages indicative of the temperature at the corresponding regions of the lid 112. Other types of temperature sensors 118 can be utilized without departing from the scope of the present disclosure.

FIG. 2A indicates that the temperature sensors 118 are positioned within the lid 112. However, the temperature sensors 118 can be positioned in other locations on the lid 112. For example, the temperature sensors 118 may be positioned on the bottom surface 123 of the lid 112. The temperature sensors 118 may be positioned on the top surface 125 of the lid 112. In some cases, some of the temperature sensors may be positioned within the lid 112 while others are positioned on the bottom surface 123.

The controller 110 receives sensor signals from the temperature sensors 118. The controller 110 controls the heater 114 responsive to the signals from the temperature sensors 118. The controller 110 can control the output of the heater 114 based on the temperature signals. The controller 110 can control the output of individual heating elements 116 based on the temperature signals from an adjacent temperature sensors 118. The controller 110 can implement a uniform temperature distribution on the bottom surface 123 of the lid 112. Alternatively, the controller 110 can implement a different selected temperature distribution on the bottom surface 120 of the lid 112.

Though not shown in FIG. 2A, the plasma etching system 200 can include the radiofrequency power source that supplies the radiofrequency voltage to the electrodes 130 via the electrical connectors 132. The controller 110 can control the function of the radiofrequency power source.

Figure 2B:
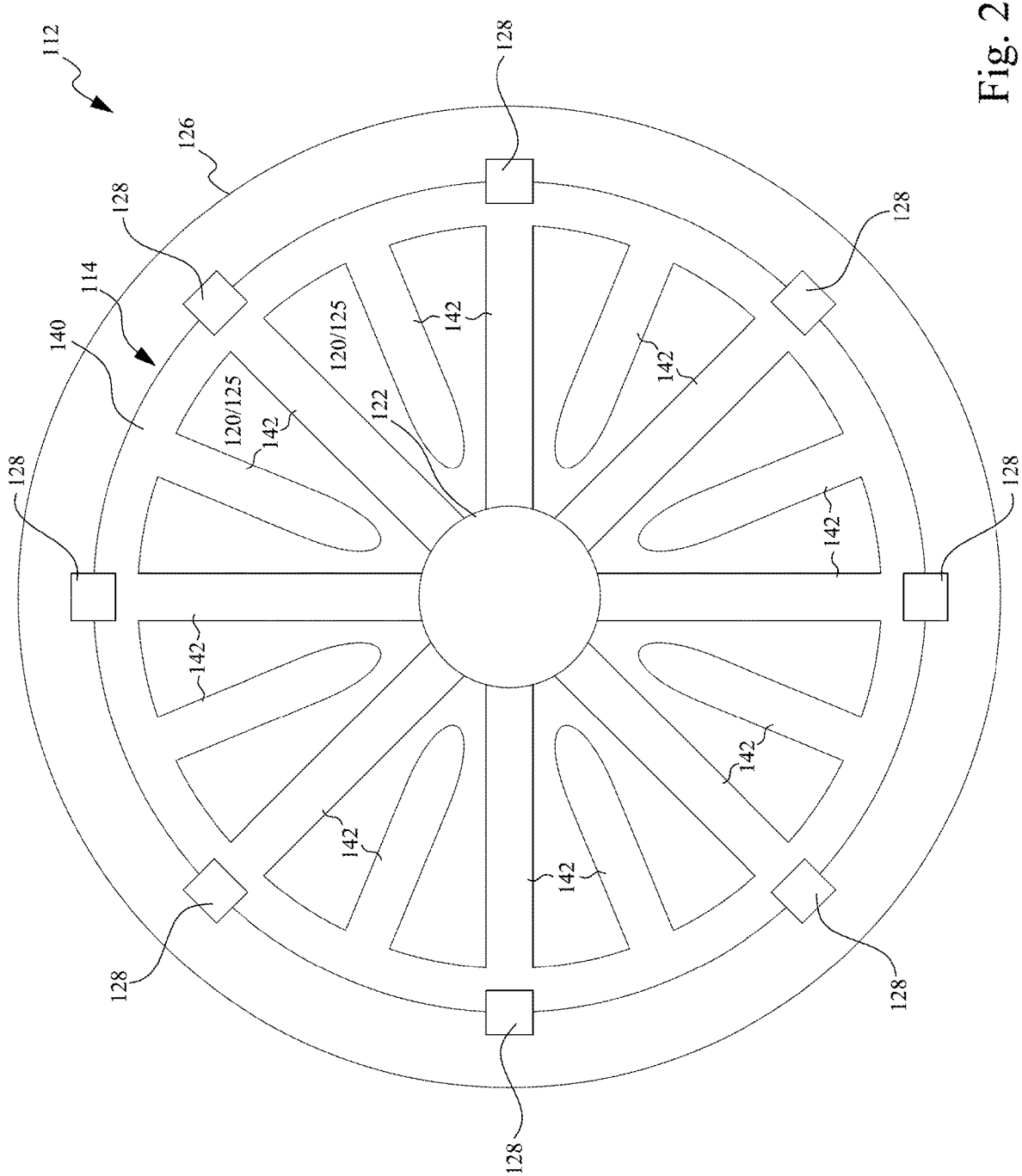
FIGS. 2B-2E are top views of a lid of a plasma etching chamber, according to some embodiments.

FIG. 2B is a top view of the lid 112 including a heater 114, according to one embodiment. The heater 114 includes an outer ring 140. The heater 114 also includes a plurality of spokes 142 extending from the outer ring 140 toward the hub 122 of the lid 112. Some of the spokes 142 extend all the way to the hub 122. Others of the spokes 142 do not extend all the way to the hub 122.

In one embodiment, the outer ring 140 and the spokes 142 of the heater 114 correspond to a single heating element. In this case, the controller 110 can selectively activate individual spokes 142 or the outer ring 140. Instead, activating the heater 114 causes the outer ring 140 and each of the spokes 142 to generate heat. A resistive element may be embedded in the heater 114, winding through the outer ring 140 and each of the spokes 142. The controller 110 can cause the currents to pass through the resistive element, thereby causing resistive elements generate heat in each of the spokes 142 and the outer ring 140. This will heat the lid 112.

In one embodiment, the outer ring 140 and each of the spokes 142 can be selectively activated with respect to each other. In this case, individual electrical connectors 117 (not shown) connect each spoke 142 to the controller 110. The controller 110 selectively activates each spoke 142 and the outer ring 140 to generate heat. In this case, the outer ring 140 and each of the spokes 142 correspond to individual heating elements 116.

The pad 120 is positioned between the heater 114 and the top surface 125 of the lid 112. The pad 120 may have the exact shape as the heater 114. In the top view of FIG. 2B, the pad 120 is not visible because the pad 120 has the same shape as the heater 114 and the pad 120 is below the heater. In this case, the top surface 125 is visible between the spokes 142. The area of the heater 114 may be larger than the area of the pad 120 or may be the same as the pad 120. Accordingly a method for operating the system 100 can include generating heat with the heater 114, transferring heat from the heater 114 to the pad 120 having a larger heating area than the heater 114, and transferring heat from the pad 120 to the lid 112.

Alternatively, the pad may be circular in shape and may cover the entirety of the top surface 125 of the lid 112. In this case, the pad 120 is visible between the spokes 142 and contact area between the heater 114 and the pad 120 is smaller than the contact area between the pad 120 and the lid 112. Accordingly a method for operating the system 100 can include generating heat with the heater 114, transferring heat from the heater 114 to the pad 120 having a larger heating area than the heater 114, and transferring heat from the pad 120 to the lid 112. Because the pad 120 entirely covers the lid 112, the pad 120 promotes uniform heating of the lid 112.

The lid 112 is circular. The lid 112 can have a radius between 200 mm and 300 mm. The hub 122 can have a radius between 20 and 50 mm. The lid ring 126 laterally surrounds the lid 112. The clamps 128 fix the outer ring 140 of the heater 114 to the lid 112. The lid ring 126 can be an integral part of the lid 112. The lid 112 and the hub 122 can have other radii without departing from the scope of the present disclosure.

Figure 2C:
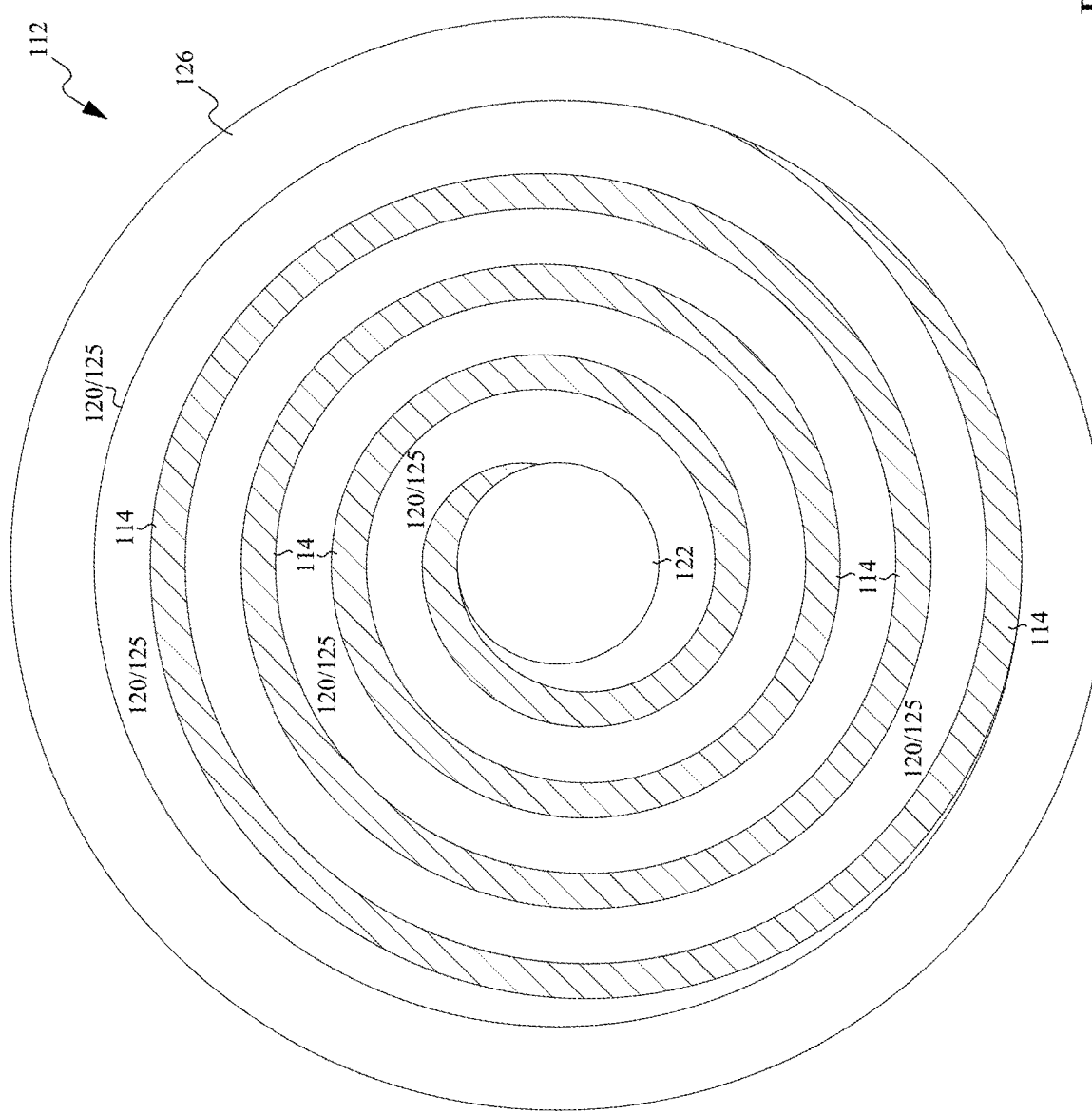

FIG. 2C is a top view of the lid 112 of the plasma etching system 200, according to some embodiments. In the view of FIG. 2C, the heater 114 is shown with a hatch pattern for clarity. The heater 114 is arranged in a spiral on the lid 112. The spiral heater 114 can include a resistive element or another heat generating element that can generate heat. In this example, the controller 110 (not shown) selectively activates or deactivates the entirety of the spiral heating element 114.

The pad 120 is positioned between the heating element 114 and the top surface 125 of the lid 112. In some embodiments, the pad 120 has the same spiral pattern as the heating element 114 and is not visible in FIG. 2C. Instead, the top surface 120 of the lid 112 is visible between portions of the spiral heating element 114. Alternatively, the pad 120 can have a circular shape covering the entirety of the top surface 125 of the lid 112. In this case, the pad 120 is visible between portions of the heating element 114.

Figure 2D:
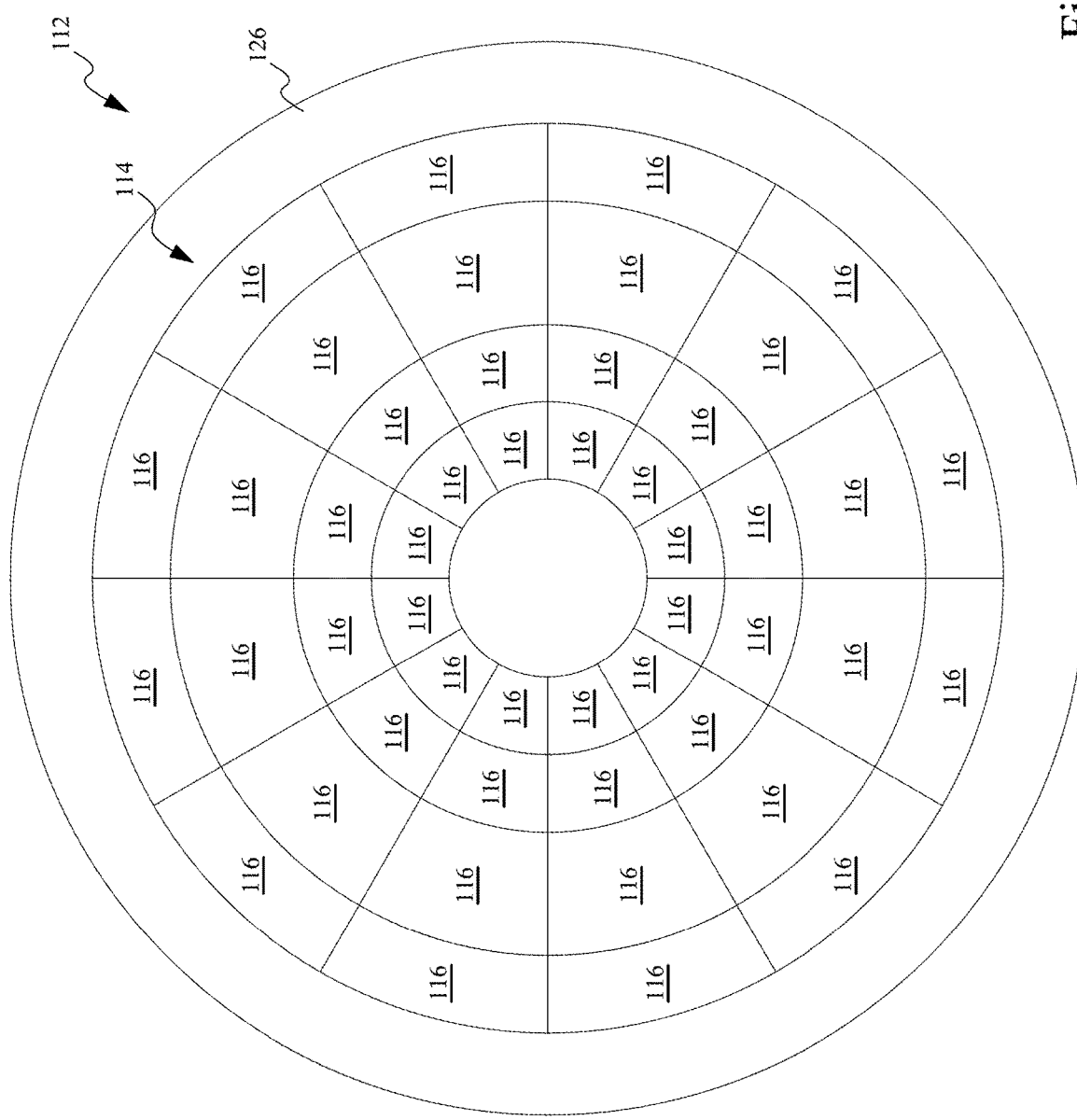

FIG. 2D is a top view of a lid 112 of the plasma etching system 200 including a heater 114, according to some embodiments. In FIG. 2D, the heater 114 includes a plurality of heating elements 116 distributed over the lid 112. Each of the heating elements 116 can be selectively activated to generate heat. Each heating element 116 may include a resistive element through which a current can be selectively passed in order to generate heat. Though not shown in FIG. 2D, each heating element 116 may be coupled to the controller 110 by one or more electrical connectors 117.

The controller 110 can selectively control each of the heating elements 116 to generate a selected heat distribution profile on the bottom surface 123 of the lid 112. In one example, the selected temperature distribution profile may be substantially uniform temperature distribution across the bottom surface 123 of the lid 112. In other examples, the selected temperature distribution profile may include higher temperatures in some regions of the bottom surface 123 of the lid 112.

Though not shown in FIG. 2D, the plasma etching system 200 can include a respective temperature sensor 118 for each heating element 116. Each temperature sensor 118 may be positioned on the bottom surface 123 or within the lid 112 below the corresponding heating elements 116. The controller 110 receives sensor signals from the heating elements 116 and controls the heating elements 116 responsive to the sensor signals.

The heating elements 116 may have a shapes other than those shown in FIG. 2D. Each heating element 116 may be circular, rectangular, or have other shapes than those shown in FIG. 2D.

Figure 2E:
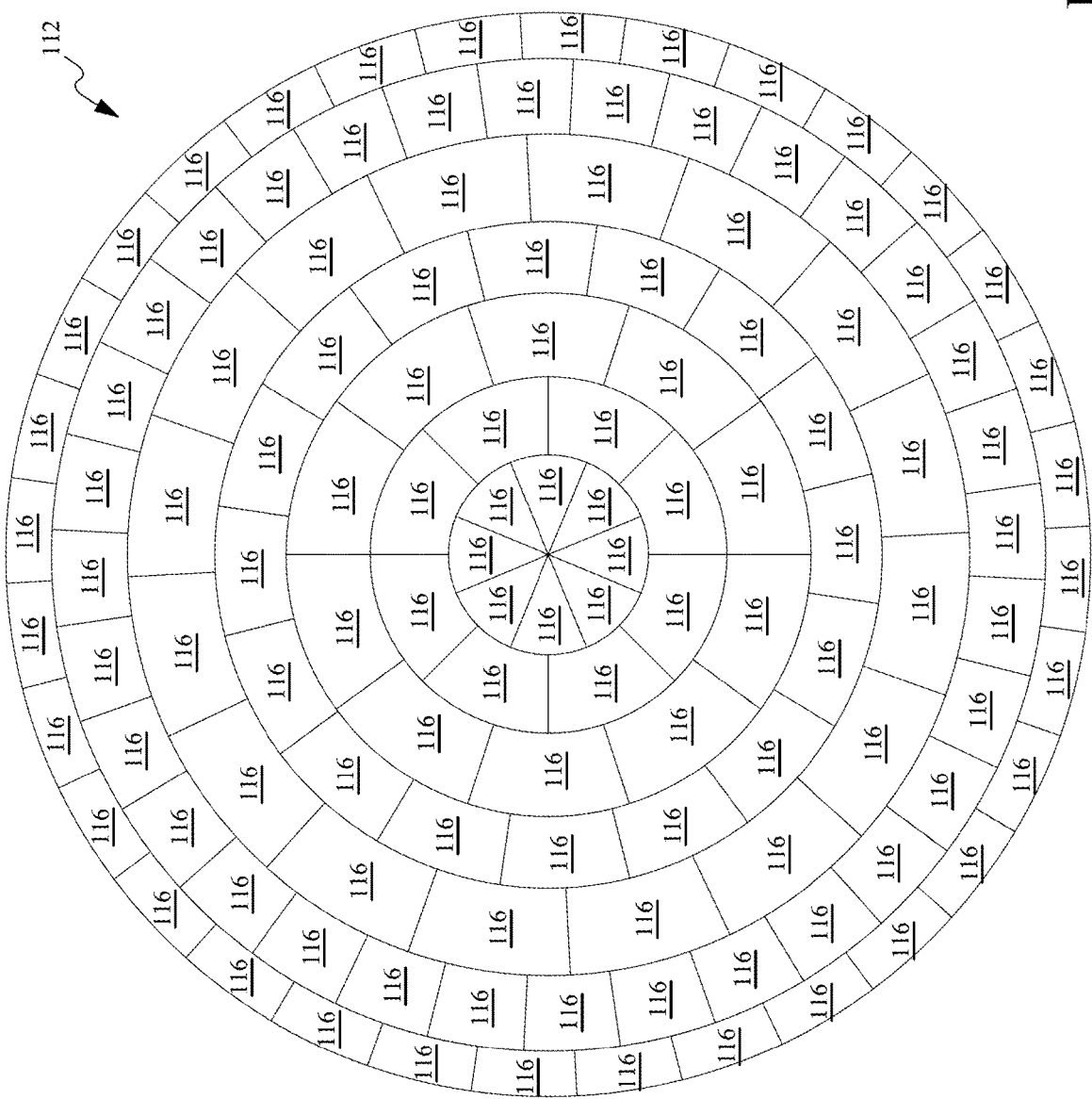

FIG. 2E is a top view of a lid 112 of the plasma etching system 200 including plurality of heating elements 116 distributed over the lid 112, according to one embodiment. Each heating element 116 heats a respective region of the lid 112. The regions are distributed in concentric rings as shown in FIG. 2E. Each of the heating elements 116 can be selectively activated to generate heat. Each heating element 116 may include a resistive element through which a current can be selectively passed in order to generate heat. Though not shown in FIG. 2E, each heating element 116 may be coupled to the controller 110 by one or more electrical connectors 117.

The controller 110 can selectively control each of the heating elements 116 to generate a selected heat distribution profile on the bottom surface 123 of the lid 112. In one example, the selected temperature distribution profile may be substantially uniform temperature distribution across the bottom surface 123 of the lid 112. In other examples, the selected temperature distribution profile may include higher temperatures in some regions of the bottom surface 123 of the lid 112.

Though not shown in FIG. 2E, the plasma etching system 200 can include a respective temperature sensor 118 for each heating element 116. Each temperature sensor 118 may be positioned on the bottom surface 123 or within the lid 112 below the corresponding heating elements 116. The controller 110 receives sensor signals from the heating elements 116 and controls the heating elements 116 responsive to the sensor signals.

The heating elements 116 may have a shapes other than those shown in FIG. 2E. Each heating element 116 may be circular, rectangular, or have other shapes than those shown in FIG. 2D.

Figure 2F:
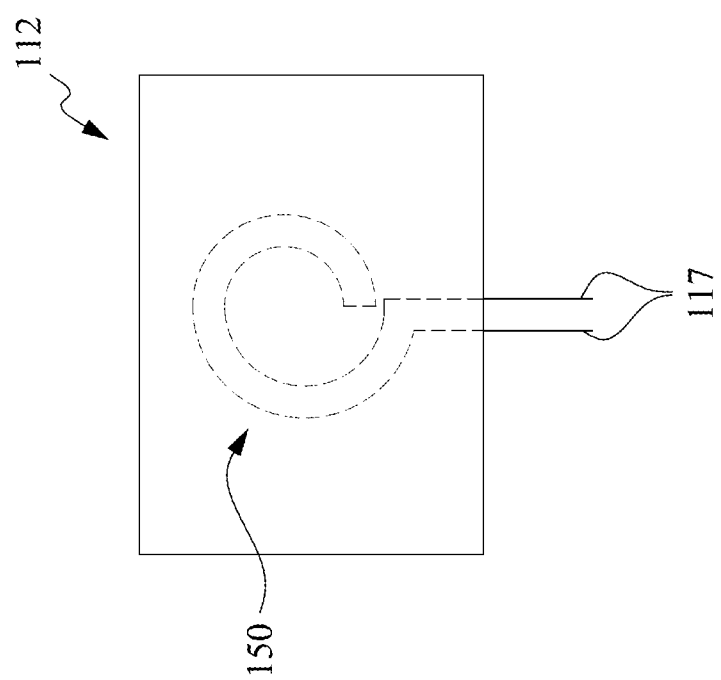
FIG. 2F is an illustration of a heating element, according to one embodiment.

FIG. 2F is a top view of a heating element 116, according to one embodiment. The heating element 116 of FIG. 2F is one example of a type of heating element that can be utilized in the heater 114 of FIGS. 1-2E. The heating element 116 generates heat in order to heat the lid 112 during a plasma etching process.

In one embodiment, the heating element 116 includes a heating coil 150. The heating element 116 generates heat when electrical current is passed through the heating coil 150. The heating coil 150 can include a conductive material such as copper, tungsten, or other conductive materials that generate the when an electrical current is passed through the heating coil 150. The heating coil 150 can also include a resistor. The heating coil 150 may be clad in an insulating material. Those of skill in the art will recognize, in light of the present disclosure, that many configurations and materials can be utilized for heating coil 150 without departing from the scope of the present disclosure.

In one embodiment, the heating coil 150 is connected to two electrical connectors 117. The two electrical connectors 117 can be coupled to the controller 110 (see FIG. 1) or to a power source controlled by the controller 110. The controller 110 can selectively pass a current to the heating coil 150 via the two electrical connectors 117. In particular, a voltage can be applied between the electrical connectors 117 in order to pass a current to the heating coil 150.

In one embodiment, each heating coil 150 can be selectively controlled by the controller 110, as described previously in relation to FIGS. 1-2D. Accordingly, each heating element 116 can include two or more electrical connectors 117 coupled to the controller 110. The controller 110 can then selectively activate, deactivate, or adjust an electrical current through the heating coil 150 via the electrical connectors 117.

Figure 2G:
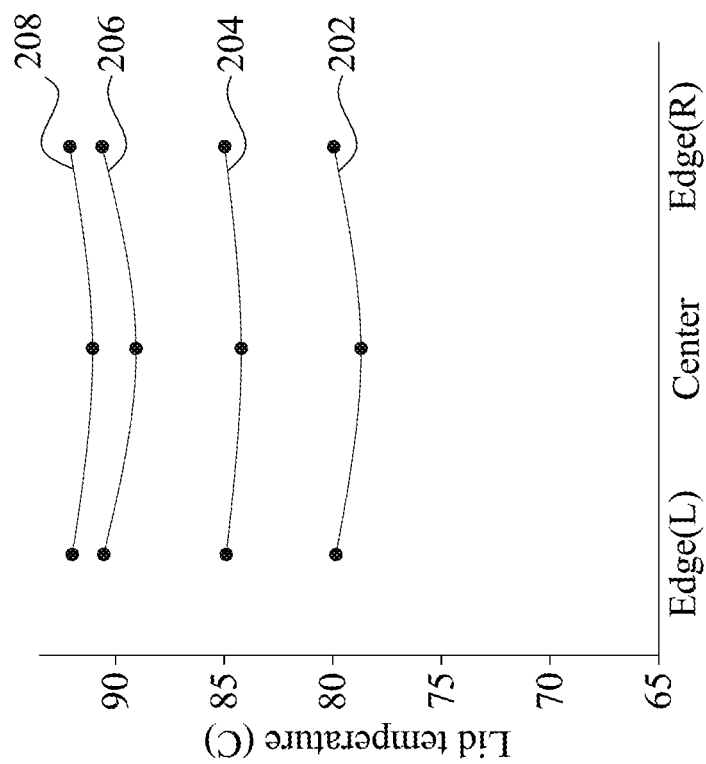
FIG. 2G is a graph of temperatures for a lid of a process chamber, according to one embodiment.

FIG. 2G is a graph illustrating temperature variation in a lid 112 including a plurality of heating elements 116 distributed at various locations in the lid as described previously, according to one embodiment. FIG. 2G includes a respective curve for each of four center temperatures. The curve 202 corresponds to an example in which the temperature at a central region of the lid 112 is about 78° C. In the curve 202, the variation between the temperature at the center of the lid and at the edges of the lid is less than 3%. The curve 204 corresponds to an example in which the temperature at a central region of the lid 112 is about 84° C. In the curve 204, the variation between the temperature at the center of the lid and at the edges of the lid is less than 1%. The curve 206 corresponds to an example in which the temperature at a central region of the lid 112 is about 89° C. In the curve 206, the variation between the temperature at the center of the lid and at the edges of the lid is less than 3%. The curve 208 corresponds to an example in which the temperature at a central region of the lid 112 is about 92° C. In the curve 208, the variation between the temperature at the center of the lid and at the edges of the lid is less than 1%. FIG. 2G illustrates that a very even temperature distribution can be achieved in the lid 112 by utilizing a plurality of heating elements 116 as described above.

Figure 3A:
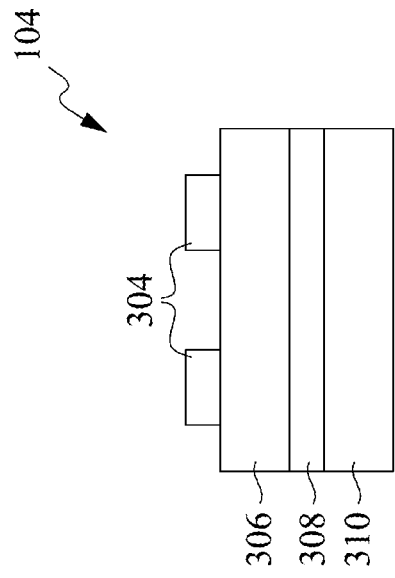
FIGS. 3A-3D are cross-sectional views of a wafer at various stages of an etching process, according to one embodiment.

FIGS. 3A-3D are cross-sectional views of a wafer 104 at successive steps of the plasma etching process, according to some embodiments. The plasma etching process may be performed by the plasma etching system 200 described in relation to FIGS. 2A-2E. In FIG. 3A the wafer 104 includes a dielectric layer 310, a semiconductor layer 308 on the dielectric layer 310, a dielectric layer 306 on the semiconductor layer 308, a metal layer 304 on the dielectric layer 306, and photo resist structures 302 on the metal layer 304. The photo resist structures 302 act as a mask for patterning the wafer 104.

In some embodiments, the dielectric layer 310 includes silicon oxide with a thickness between 300 Å and 500 Å. The semiconductor layer 308 include silicon with a thickness between 200 Å and 400 Å. The dielectric layer 306 include silicon nitride with a thickness between 400 Å and 600 Å. The metal layer 304 includes titanium with a thickness between 150 Å and 200 Å. The photoresist structures 302 have a thickness between 400 Å and 600 Å. Other thicknesses and materials can be utilized for the various structures of the wafer 104 without departing from the scope of the present disclosure.

Figure 3B:
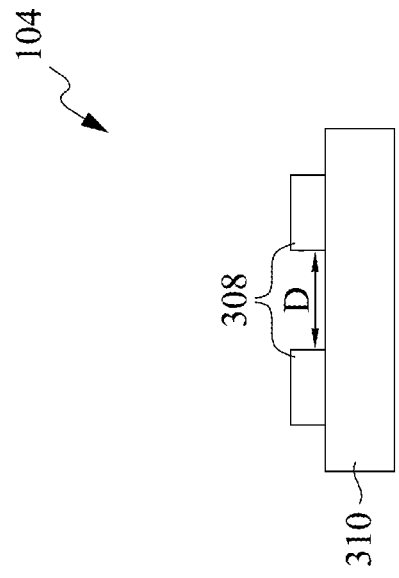

In FIG. 3B, the metal layer 304 has been patterned with a first plasma etching step. The first plasma etching step patterns the metal layer 304 in accordance with the pattern of the photo resist structures 302 of FIG. 3A. The first plasma etching step includes introducing an etching fluid into the interior volume 103. A plasma is generated from the etching fluid. The plasmatized etching fluid etches the exposed portions of the metal layer 304, leaving the metal layer 304 in the pattern of the photo resist structures 302. During the first plasma etching step, the controller 110 controls the heater 114 to maintain a selected temperature distribution of the bottom surface 123 of the lid 112 (see FIG. 2A). After the first plasma etching step, the photo resist structures 302 are removed, leaving the structure shown in FIG. 3B.

Figure 3C:
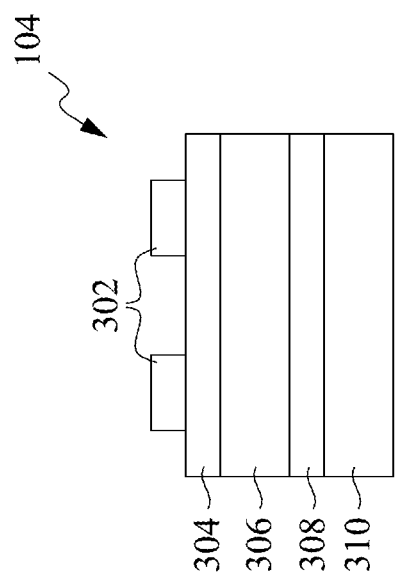

In FIG. 3C, the dielectric layer 306 has been patterned with a second plasma etching step. The second plasma etching step patterns the dielectric layer 306 in accordance with the pattern of the metal layer 304 of FIG. 3B. The second plasma etching step includes introducing an etching fluid into the interior volume 103. A plasma is generated from the etching fluid. The plasmatized etching fluid etches the exposed portions of the dielectric layer 306, leaving the dielectric layer 306 in the pattern of the photo resist structures 302. During the second plasma etching step, the controller 110 controls the heater 114 to maintain a selected temperature distribution of the bottom surface 123 of the lid 112 (see FIG. 2A). After the second plasma etching step, the metal layer 304 is removed, leaving the structure shown in FIG. 3C.

Figure 3D:
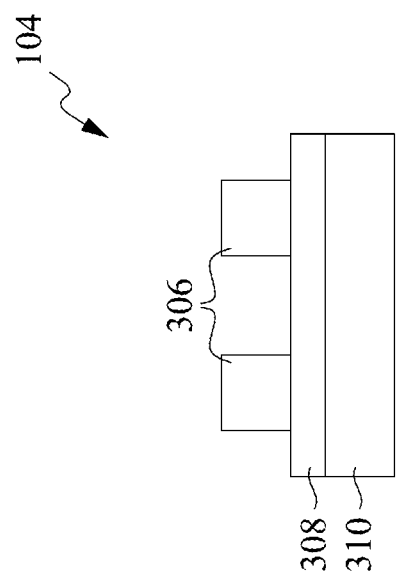

In FIG. 3D, the semiconductor layer 308 has been patterned with a third plasma etching step. The third plasma etching step patterns the semiconductor layer 308 in accordance with the pattern of the dielectric layer 306 of FIG. 3C. The third plasma etching step includes introducing an etching fluid into the interior volume 103. A plasma is generated from the etching fluid. The plasmatized etching fluid etches the exposed portions of the semiconductor layer 308, leaving the semiconductor layer 308 in the pattern of the photo resist structures 302. During the third plasma etching step, the controller 110 controls the heater 114 to maintain a selected temperature distribution of the bottom surface 123 of the lid 112 (see FIG. 2A). After the third plasma etching step, the dielectric layer 306 is removed, leaving the structure shown in FIG. 3D.

The process shown and described in relation to FIGS. 3A-3D results in the semiconductor layer 308 having a selected pattern. This pattern is present at many locations on the wafer 104. In one example, the distance D between the remaining structures of the semiconductor layer 308 is the same in all regions of the wafer 104. This is due, in part, to controlling the temperature distribution of the bottom surface 123 of the lid 112. The temperature distribution of the bottom surface 123 of the lid 112 can affect the temperature distribution of the wafer 104. By controlling the temperature distribution of the wafer 104 during the various steps of the plasma etching process, the distance D between structures of the semiconductor layer 308 is substantially constant throughout the various regions of the wafer 104.

The plasma etching process can include more or fewer steps than those described in relation to FIGS. 3A-3D. Other combinations of steps and variations in the steps can be utilized without departing from the scope of the present disclosure.

Figure 4:
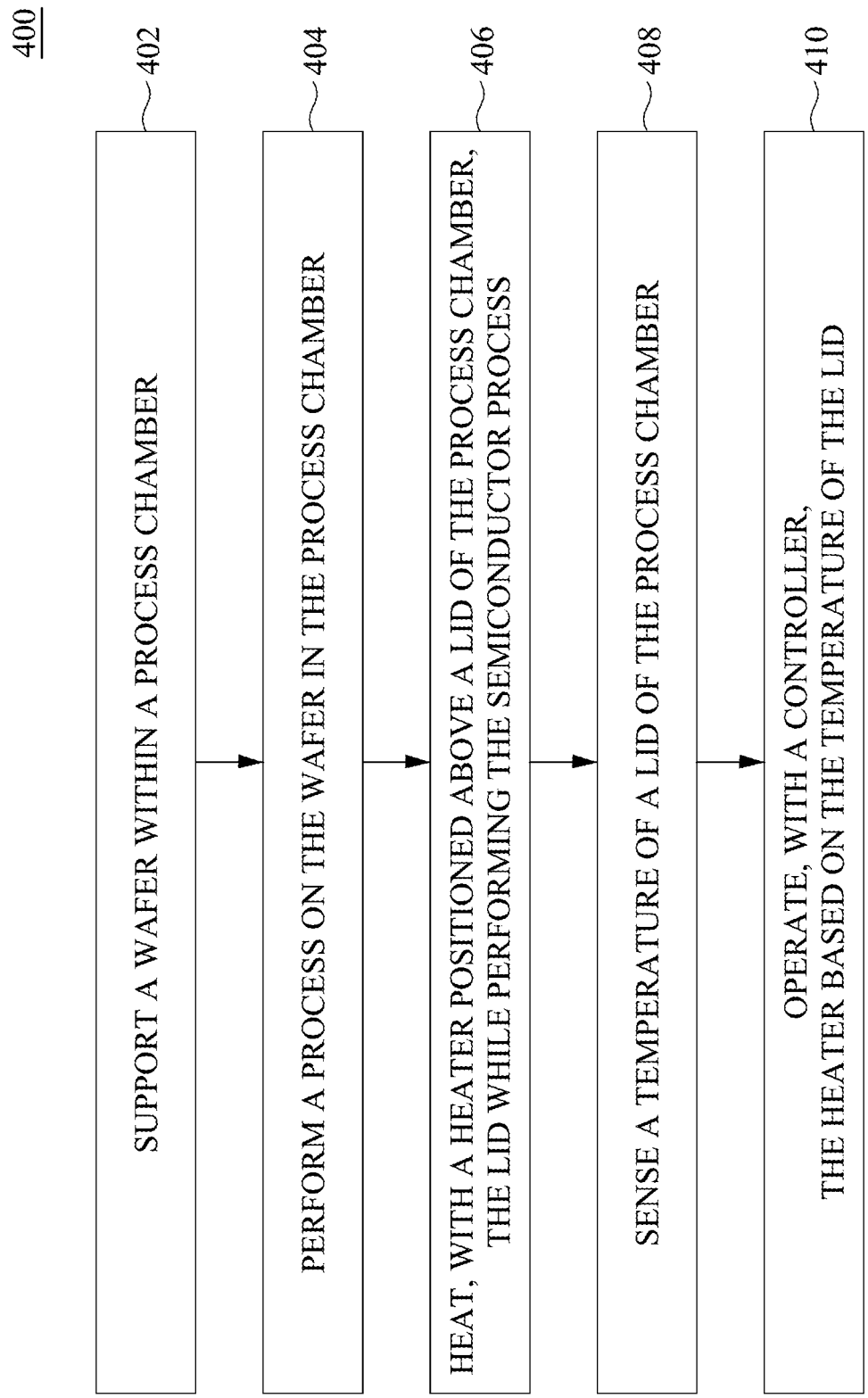
FIG. 4 is a flow diagram of a method for operating a semiconductor process system, according to one embodiment.

FIG. 4 is a flow diagram of a method 400 for operating a semiconductor process system, according to one embodiment. The method 400 can utilize the systems, components and processes described in relation to FIGS. 1-3D. At 402, the method 400 includes supporting a wafer within a process chamber. One example of a wafer is the wafer 104 of FIG. 1. One example of a process chamber is the process chamber 102 of FIG. 1. At 404, the method 400 includes performing a process on the wafer in the process chamber. At 406, the method 400 includes heating, with a heater positioned above a lid of the process chamber, the lid while performing the semiconductor process. One example of a lid is the lid 112 of FIG. 1. One example of a heater is the heater 114 of FIG. 1. At 408, the method 400 includes sensing a temperature of the lid of the process chamber. At 410, the method includes operating, with a controller, the heater based on the temperature of the lid. One example of a controller is the controller 110 of FIG. 1.

In one embodiment, a semiconductor process system includes a process chamber, a wafer support in the process chamber and configured to support a wafer in the process chamber, a lid enclosing the process chamber and positioned above the wafer support, and a heater on the lid and configured to heat the lid during a semiconductor process. The system includes a temperature sensor coupled to the lid and configured to generate sensor signals indicative of a temperature of the lid. The system includes a controller coupled to the temperature sensor and the heater and configured to control the heater based on the sensor signals.

In one embodiment, a method includes supporting a wafer within a process chamber, performing a process on the wafer in the process chamber, and heating, with a heater positioned above a lid of the process chamber, the lid while performing the semiconductor process. The method includes sensing a temperature of a lid of the process chamber and operating, with a controller, the heater based on the temperature of the lid.

In one embodiment, a plasma etching system includes a plasma etching process chamber including a lid, a plurality of heating elements positioned on the lid, one or more temperature sensors coupled to the lid and configured to generate sensor signals indicative of a temperature of the lid, and a controller configured to control a temperature of the lid by selectively operating the heating elements based on the sensor signals.

Embodiments of the present disclosure provide many benefits over traditional semiconductor process systems. Embodiments of the present disclosure promote uniformity of features on a wafer by selectively heating the lid of a semiconductor process system. The temperature of the lid of the process system can affect the temperature of a wafer being processed. Embodiments of the present disclosure provide a lid with an array of heating elements that can be selectively operated during a semiconductor process to ensure a selected temperature distribution across the lid. Carefully controlling the temperature of the lid during the process promotes uniform features in the wafer. The result is that integrated circuits diced from the wafer will have uniform features and functionality. Fewer integrated circuits and wafers will be scrapped. Thus, wafer yields are greatly increased.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process system, comprising:
 a process chamber;
 a wafer support in the process chamber and configured to support a wafer in the process chamber;
 a lid enclosing the process chamber and positioned above the wafer support;
 a heater on the lid and configured to heat the lid during a semiconductor process, wherein the heater includes a first heating element and a second heating element;
 a temperature sensor coupled to the lid and configured to generate sensor signals indicative of a temperature of the lid; and
 a controller coupled to the temperature sensor and the heater and configured to activate the first heating element and deactivate the second heating element based on the sensor signals.

2. The system of claim 1, further comprising a pad positioned on a top surface of the lid, the heater being positioned on the pad.

3. The system of claim 1, wherein the controller is configured to control the heater to promote a selected temperature distribution of the lid.

4. The system of claim 1, wherein the temperature sensor is a thermocouple.

5. The system of claim 1, wherein the heater includes a third heating element and a fourth heating element, wherein the first, second, third, and fourth heating elements each disposed to heat a respective region of the lid.

6. The system of claim 1, wherein the controller is configured control the heating elements to promote an even temperature distribution on a bottom surface of the lid.

7. The system of claim 1, wherein the heater is in a spiral shape on the lid.

8. The system of claim 1, wherein the heater includes:
 an outer ring; and
 a plurality of spokes extending inward from the outer ring.

9. The system of claim 1, wherein the first heating element and the second heating element includes a respective heating coil.

10. The system of claim 9, further comprising a pad positioned between the lid and the first and second heating elements.

11. The system of claim 10, wherein the pad includes a conductive material embedded in a polymer.

12. A method, comprising:
supporting a wafer within a process chamber;
performing a process on the wafer in the process chamber;
heating, with a heater positioned above a lid of the process chamber, the lid while performing the semiconductor process;
generating first sensor signals indicative of a temperature of the lid adjacent to a first heating element of the heater;
generating second sensor signals indicative of a temperature of the lid adjacent to a second heating element of the heater;
operating, with a controller, the first heating element based on the first sensor signals; and
operating, with the controller, the second heating element based on the second sensor signals.

13. The method of claim 12, further comprising controlling, with the controller, the heater to generate an even temperature distribution across the lid.

14. The method of claim 12, wherein heating the lid includes selectively activating, with the controller, the first heating element and selectively deactivating the second heating element.

15. The method of claim 12, wherein the process is a plasma etching process.

16. A plasma etching system, comprising:
a plasma etching process chamber including a lid;
a first heating element and a second heating element positioned on the lid;
a first temperature sensor coupled to the lid adjacent to the first heating element and configured to generate sensor signals indicative of a temperature of the lid adjacent to the first heating element;
a first temperature sensor coupled to the lid adjacent to the first heating element and configured to generate sensor signals indicative of a temperature of the lid adjacent to the first heating element; and
a controller configured to operate the first heating element based on the first sensor signals and to operate the second heating element based on the second sensor signals.

17. The system of claim 16, further comprising one or more electrodes configured to generate a plasma within the plasma etching chamber.

18. The system of claim 16, wherein each heating element includes a respective heating coil.

19. The system of claim 16, further comprising a pad positioned between the lid and the first and second heating elements.

20. The system of claim 19, wherein the pad includes a conductive material embedded in a polymer.

\* \* \* \* \*